United States Patent
Chan et al.

(10) Patent No.: US 11,638,391 B2
(45) Date of Patent: Apr. 25, 2023

(54) METHOD FOR PROCESSING A SEMICONDUCTOR DEVICE WITH TWO CLOSELY SPACED GATES

(71) Applicant: IMEC VZW, Leuven (BE)

(72) Inventors: Boon Teik Chan, Wilsele (BE); Ruoyu Li, Leuven (BE); Stefan Kubicek, Pellenberg (BE); Julien Jussot, Kessel-Lo (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 17/345,827

(22) Filed: Jun. 11, 2021

(65) Prior Publication Data
US 2021/0391526 A1    Dec. 16, 2021

(30) Foreign Application Priority Data

Jun. 12, 2020 (EP) .................................. 20179631

(51) Int. Cl.
| | |
|---|---|
| *H10N 60/01* | (2023.01) |
| *H10N 60/10* | (2023.01) |
| *H10N 60/83* | (2023.01) |
| *H10N 69/00* | (2023.01) |

(52) U.S. Cl.
CPC .............. *H10N 60/01* (2023.02); *H10N 60/11* (2023.02); *H10N 60/128* (2023.02); *H10N 60/83* (2023.02); *H10N 69/00* (2023.02)

(58) Field of Classification Search
CPC ......... H01L 39/24; H01L 27/18; H01L 39/08; H01L 39/221; H01L 39/228; H01L 27/088; H01L 27/0922; H01L 29/0649; H01L 29/0692; H01L 29/413; H01L 29/423; H01L 29/66439; H01L 29/66977; H01L 29/7613
See application file for complete search history.

(56) References Cited

U.S. PATENT DOCUMENTS

| | | | |
|---|---|---|---|
| 9,842,921 B2 * | 12/2017 | Eriksson | ............... H01L 27/088 |
| 2014/0193980 A1 | 7/2014 | Lee et al. | |
| 2015/0279981 A1 | 10/2015 | Eriksson et al. | |
| 2016/0300155 A1 | 10/2016 | Betz et al. | |
| 2019/0044048 A1 | 2/2019 | George et al. | |
| 2019/0044049 A1 | 2/2019 | Thomas et al. | |
| 2019/0198618 A1 | 6/2019 | George et al. | |
| 2019/0229189 A1 | 7/2019 | Clarke et al. | |
| 2020/0066629 A1 | 2/2020 | Schenker et al. | |

OTHER PUBLICATIONS

Extended European Search Report and Written Opinion, Application No. EP20179631.5, dated Dec. 7, 2020, 11 pages.

* cited by examiner

*Primary Examiner* — Matthew L Reames

(74) *Attorney, Agent, or Firm* — McDonnell Boehnen Hulbert & Berghoff LLP

(57) ABSTRACT

A method for processing a semiconductor device with two closely space gates comprises forming a template structure, wherein the template structure includes at least one substructure having a dimension less than the CD. The method further comprises forming a gate layer on and around the template structure. Then, the method comprises removing the part of the gate layer formed on the template structure, and patterning the remaining gate layer into a gate structure including the two gates. Further, the method comprises selectively removing the template structure, wherein the spacing between the two gates is formed by the removed sub-structure.

16 Claims, 9 Drawing Sheets

METHOD FOR PROCESSING A SEMICONDUCTOR DEVICE WITH TWO CLOSELY SPACED GATES

CROSS-REFERENCE TO RELATED APPLICATIONS

The present application is a non-provisional patent application claiming priority to European Patent Application No. 20179631.5, filed Jun. 12, 2020, the contents of which are hereby incorporated by reference.

FIELD OF THE DISCLOSURE

The present disclosure relates to semiconductor processing. In particular, the disclosure relates to a method for processing a semiconductor device with two closely space gates.

BACKGROUND

With the ongoing miniaturization of semiconductor devices, the distances between gates (i.e., the gate electrodes) become increasingly smaller. In particular, semiconductor devices that employ quantum effects, e.g., make use of quantum dots (QDs), quantum wires, or other low-dimensional structures, typically require gates that are separated from each other by no more than a CD. For instance, a CD from the tip of one gate to the tip of another gate (i.e., a tip-to-tip spacing) may have to be less than 50 nm, or even less than 30 nm for best device performance. Fabricating such semiconductor devices is very challenging, and new integration schemes are thus required.

For example, for the successful implementation of silicon spin-qubit-based quantum computations, it is crucial to achieving high qubit readout signals. In this respect, a widely adopted approach is a semiconductor device using a single electron transistor (SET) to read out spin-qubits defined by a string of QDs. Thereby, the SET also serves as a qubit reservoir. In such a SET-based spin-qubit device, the spacing between a gate confining the QDs and a gate of the SET is a key design parameter. A smaller spacing leads to significantly improved readout sensitivity. In particular, a spacing of less than 30 nm would be desired between the SET gate and the confinement gate.

FIG. 1 shows two gates GA and GB of a semiconductor device formed very close together on the same gate layer, i.e., with a distance of at most 50 nm. The gate material may exemplarily be TiN.

In a first example method to fabricate such a semiconductor device, the small gate spacing could be achieved by overlapping multiple gate layers. However, the overlapping introduces extra gate dielectrics, which may negatively contribute to the device characteristics. For instance, the extra dielectrics may lead to charge noise, which is particularly detrimental for the above-mentioned spin-qubit-based device. Therefore, the number of gate layers for such a device needs to be limited to less than three layers. In addition, this method involves a rather complex process.

In a second example method, a cut lithography is used. That is, the whole gate pattern, including the two gates GA and GB, is printed, e.g., by electron beam lithography, and is then cut/etched to form the two separate gates GA and GB. However, the etch placement is thereby crucial, and aligning the etching tool with the previously printed gate pattern typically involves an overlay error of 8-15 nm. Further, a positive tone development (PTD) resist is needed in this case for the electron beam lithography, making the implementation difficult since electron beam lithography typically works much better with a negative tone development (NTD) resist. Another problem is that in the case of TiN being the gate material, the etching may lead to a tip shrinkage in the range of 15-20 nm for each gate tip, which makes it nearly impossible to achieve a spacing between the two gates of less than 50 nm, or even of less than 30 nm.

In a third example method, a spacer-defined process is used. That is, a thick spacer is grown underneath one gate (e.g., below the gate of the SET in the above-mentioned spin-qubit device). However, it is difficult to pattern the two vertically displaced gates. In addition, it is difficult to remove the spacer.

SUMMARY

Embodiments presented herein provide an improved method for fabricating a semiconductor device with two gates placed closely together. An aspect provides a reliable and straightforward method for forming the two gates on the same gate layer with a spacing below a CD. In an example, the spacing is less than 50 nm. In another example, the spacing is less than 30 nm.

In particular, example embodiments address the challenge of the small gate spacing by using a "gate zero" (G0) layer that acts as a self-aligned mask for a "gate one" (G1) layer. In an example, the CD of the G0 layer is in the range of 10-30 nm. Meanwhile, by extending the G0 layer to a fanout region, the patterning of subsequent gate layers (e.g., the G1 layer) can be simplified and made less critical.

A first aspect of the present disclosure provides a method for processing a semiconductor device, wherein the semiconductor device comprises two gates separated by a spacing, and wherein the method comprises: forming a template structure, wherein the template structure includes at least one sub-structure having a dimension less than a critical dimension (CD); forming a gate layer on and around the template structure; removing the part of the gate layer formed on the template structure; patterning the remaining gate layer into a gate structure including the two gates; and selectively removing the template structure, wherein the spacing between the two gates is formed by the removed sub-structure.

The method of the first aspect may form a very small spacing between the two gates, while avoiding certain aspects of the example methods mentioned above. The method is thereby reliable and comparatively simple.

Notably, the template structure may be the "gate zero layer," and the gate layer may be the "gate one layer," as mentioned above.

In example implementations of the method, the CD is 50 nm or less, 40 nm or less, or 30 nm or less.

That is, the method can form a spacing between the two gates of less than 40 nm, or less than 40 nm, or even less than 30 nm. Thus, it may be used in the fabrication of a SET gate close to a confinement gate in a spin-qubit device.

In an implementation of the method, the template structure is formed by electron beam lithography, optical lithography, or extreme ultraviolet lithography.

This allows patterning the template structure, and in particular, the sub-structure having one or more dimensions less than the CD, with high precision and reliability.

In an implementation of the method, the electron beam lithography comprises printing the shape of the template structure into a negative tone resist by electron beam.

The NTD resist allows the electron beam lithography to produce particularly small sub-structures, and overcomes the disadvantages of the example methods that use PTD resist.

In an implementation of the method, the template structure is formed by providing a template layer, coating the template layer with a negative tone resist, patterning the negative tone resist by electron beam printing and negative tone development, and etching the template layer using the patterned negative tone resist as a mask.

In an implementation of the method, the negative tone resist comprises a spin on carbon (SOC) layer and/or a spin on glass (SOG) layer.

In an implementation of the method, the template structure comprises amorphous silicon covered by a hardmask layer.

In an implementation of the method, the hardmask layer comprises a $Si_3N_4$ layer, or a SOC/SOG layer stack, or a SiOC/Advanced Patterning Film (APF) layer stack.

In an implementation of the method, the part of the gate layer formed on the template structure is removed by chemical mechanical polishing (CMP).

In an implementation of the method, the hardmask layer serves as an etch stop for the CMP.

Thus, the gate layer can be removed accurately from the template structure.

In an implementation of the method, patterning the remaining gate layer into the gate structure comprises etching the gate layer, wherein the hardmask layer serves as an etch stop for the gate layer etching.

Thus, the gate layer can be patterned accurately. Notably, patterning the gate layer is relaxed in comparison with the example methods, since the spacings between the gates and other small gaps do not have to be patterned when using the method of the first aspect.

In an implementation of the method, the gate layer comprises titanium nitride.

In an implementation of the method, the template structure is removed by wet etching using a hot phosphoric acid, or is removed by selective dry etching.

In an implementation of the method, the semiconductor device comprises a single electron transistor (SET) that is coupled to a string of quantum dots (QD); and the spacing separates a gate of the SET from a confinement gate defining the string of QD.

The spacing can be less than 30 nm, thus significantly improving the spin-qubit readout.

In an implementation of the method, the template structure comprises a second sub-structure. In an example, the substructure has a dimension less than 50 nm or less than the CD; the string of QD is formed between the confinement gate and a second confinement gate; the two confinement gates are separated by a second spacing; and the second spacing between the confinement gates is formed by the removed second sub-structure of the template structure.

In an example, the second substructure is formed with a high aspect ratio between length and width. While the width may be less than 50 nm, or even less than 30 nm, the length can be much larger, allowing multiple qubits to be defined between the confinement gates. The width can be kept constant along the length of the sub-structure.

In an implementation of the method, the template structure comprises a gap having a dimension less than the CD; the gate of the SET is formed by forming the gate layer in the gap and then removing the part of the gate layer formed on top of the template structure; and the dimension of the gap defines a length of the gate of the SET.

Within examples, the gate length is configured to be 50 nm or less, or even 30 nm or less.

A second aspect of the present disclosure provides a semiconductor device fabricated by using the method according to the first aspect or any implementation forms thereof.

An example of the semiconductor device has well-defined spacings and gate length that are less than a CD, for instance, less than 50 nm, or even less than 30 nm.

BRIEF DESCRIPTION OF THE FIGURES

The above, as well as additional features, will be better understood through the following illustrative and non-limiting detailed description of example embodiments, with reference to the appended drawings.

All the figures are schematic, not necessarily to scale, and generally only show parts that are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout. Further, in the claims as well as in the description, the word "comprising" does not exclude other elements or steps and the indefinite article "a" or "an" does not exclude a plurality.

FIG. 2-FIG. 5 show a method 20 according to an embodiment. In particular, steps 21-25 of the method 20 are illustrated. The method 20 is suitable for processing a semiconductor device 90 (e.g., see FIG. 9), wherein the semiconductor device 90 comprises at least two gates 41 and 43 (e.g., see FIG. 4 or FIG. 9) separated by a spacing 4a (see FIG. 5).

Figure 1:
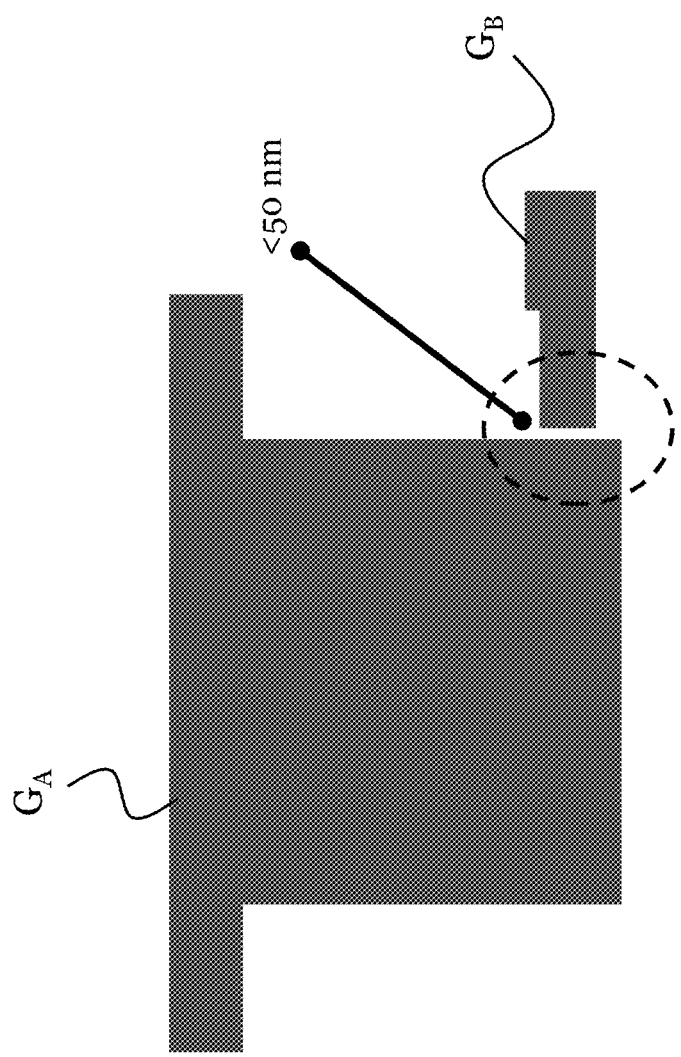
FIG. 1 shows two gates of a semiconductor device spaced close to each other.
Figure 2:
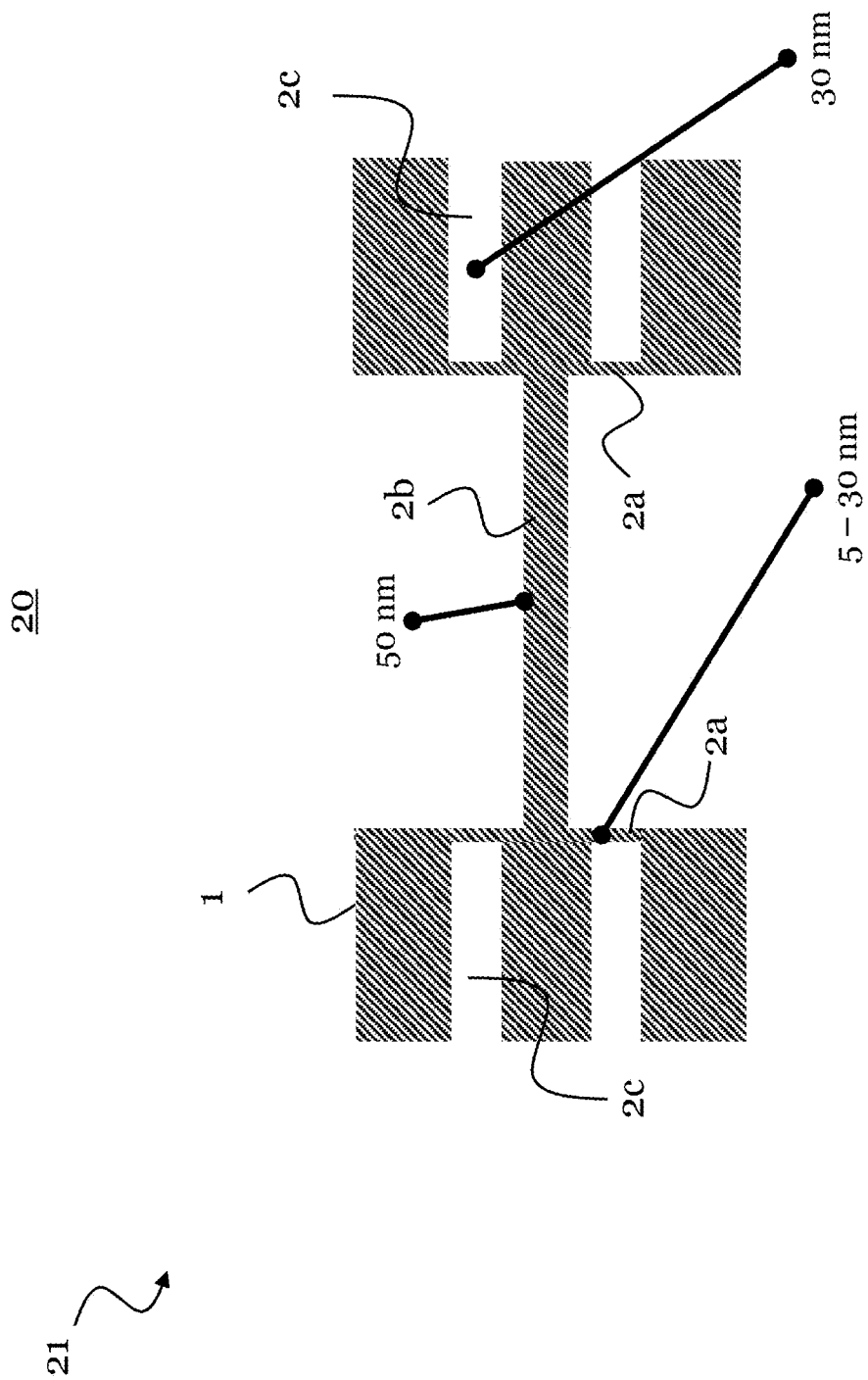
FIG. 2 illustrates steps of a method for forming a semiconductor device, in accordance with an example embodiment.

FIG. 2 shows a step 21 of the method 20. In particular, in step 21, a template structure 1 is formed. The template structure 1 includes at least one sub-structure 2a that has a dimension less than a CD. For instance, in an example, the CD is 50 nm or less. In another example, the CD is 30 nm or less.

Figure 9:
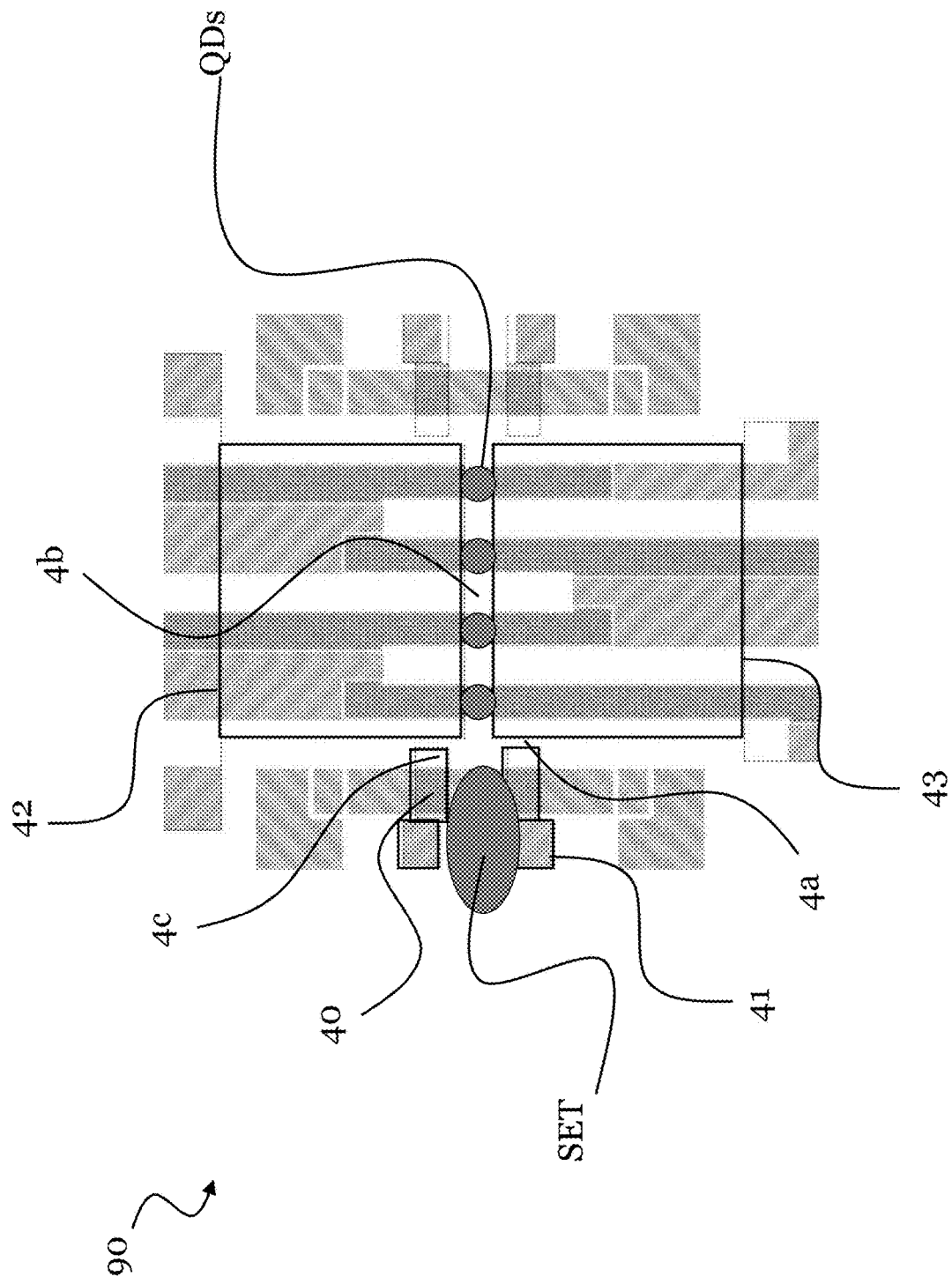
FIG. 9 shows a semiconductor device, in accordance with an example embodiment.

The particular template structure 1 shown in FIG. 2 is merely an example. This template structure 1 comprises two sub-structures 2a, which are on the order of 5-30 nm. Further, the example template structure 1 comprises a second sub-structure 2b, which has a width of around 50 nm. The example template structure 1 further comprises a plurality of gaps 2c, each of which has a gap width of 30 nm. This example template structure 1 is suitable to process a spin-qubit semiconductor device 90, as shown in FIG. 9. However, other template structures 1 for processing other types of semiconductor devices can likewise be used to implement the method 20.

The template structure 1 may also be referred to as a G0 layer, which is formed prior to a gate layer 3 (see FIG. 3), which may be referred to as a G1 layer. The template structure 1 can be printed by a NTD resist, which makes electron beam lithography feasible for obtaining the particular shape of the template structure 1. That is, the template structure 1, in particular the sub-structures 2a, 2b and the gaps 2c, can be printed by an electron beam into the NTD resist, which may then be developed and etched, or the like, to obtain the desired template structure 1 shape.

Structures of critical CD in the gate layer 3 can be defined by the template structure 1. The template structure 1 may comprise amorphous silicon, $Si_3N_4$, a SOC/SOG layer stack, and/or a SiOC/APF layer stack.

Figure 3:
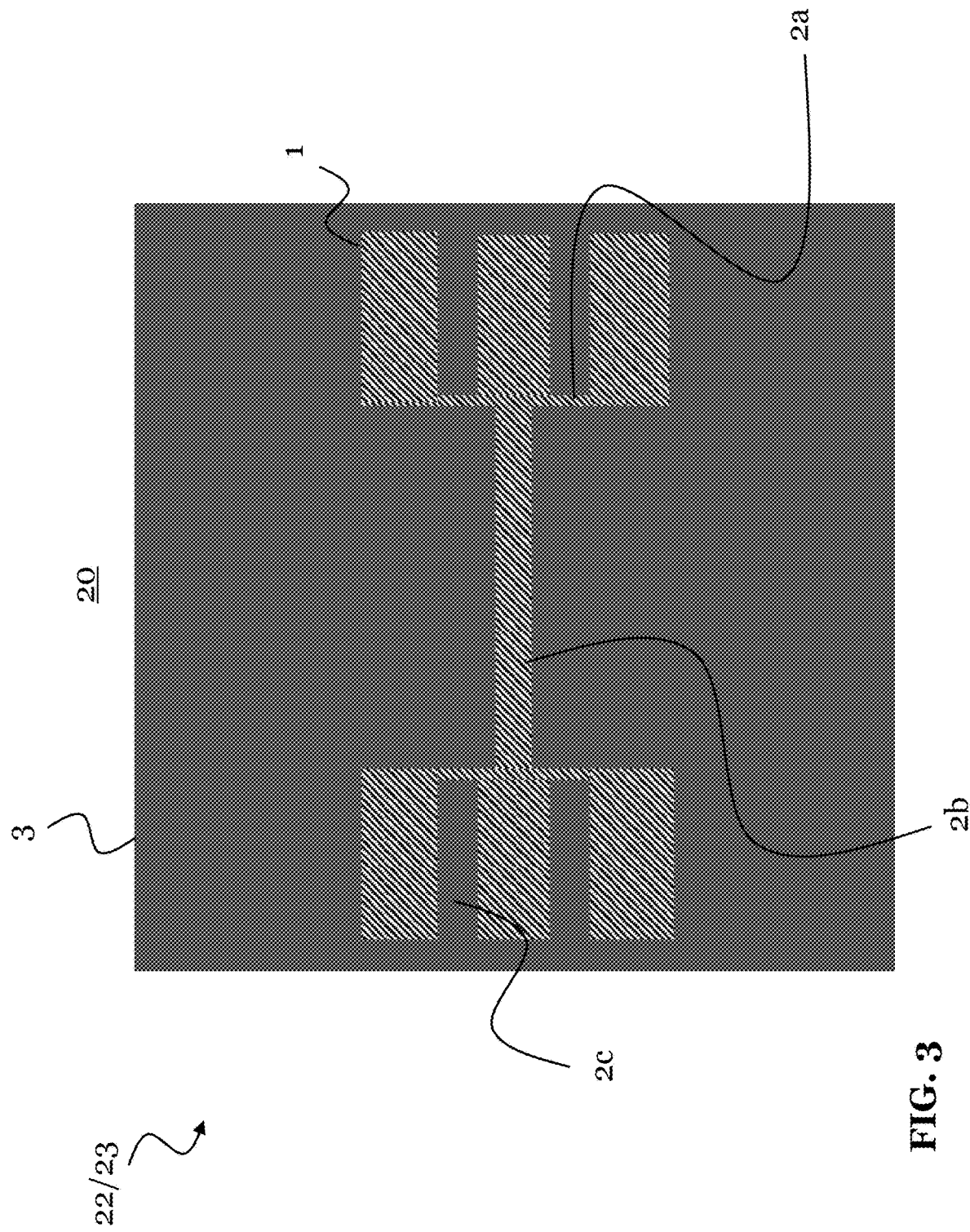
FIG. 3 illustrates further steps of the method, in accordance with an example embodiment.

FIG. 3 shows steps 22 and 23 of the method 20. In particular, in step 22, a gate layer 3 (e.g., the G1 layer) is formed on and around the template structure 1. Then, in step 23, the part of the gate layer 3 formed on the template structure 1 is removed. FIG. 3 shows the intermediate structure after step 23. The template structure 1 is exposed where the gate layer 3 is removed. The part of the gate layer 3 that is formed on the template structure 1 may be removed by CMP.

Figure 4:
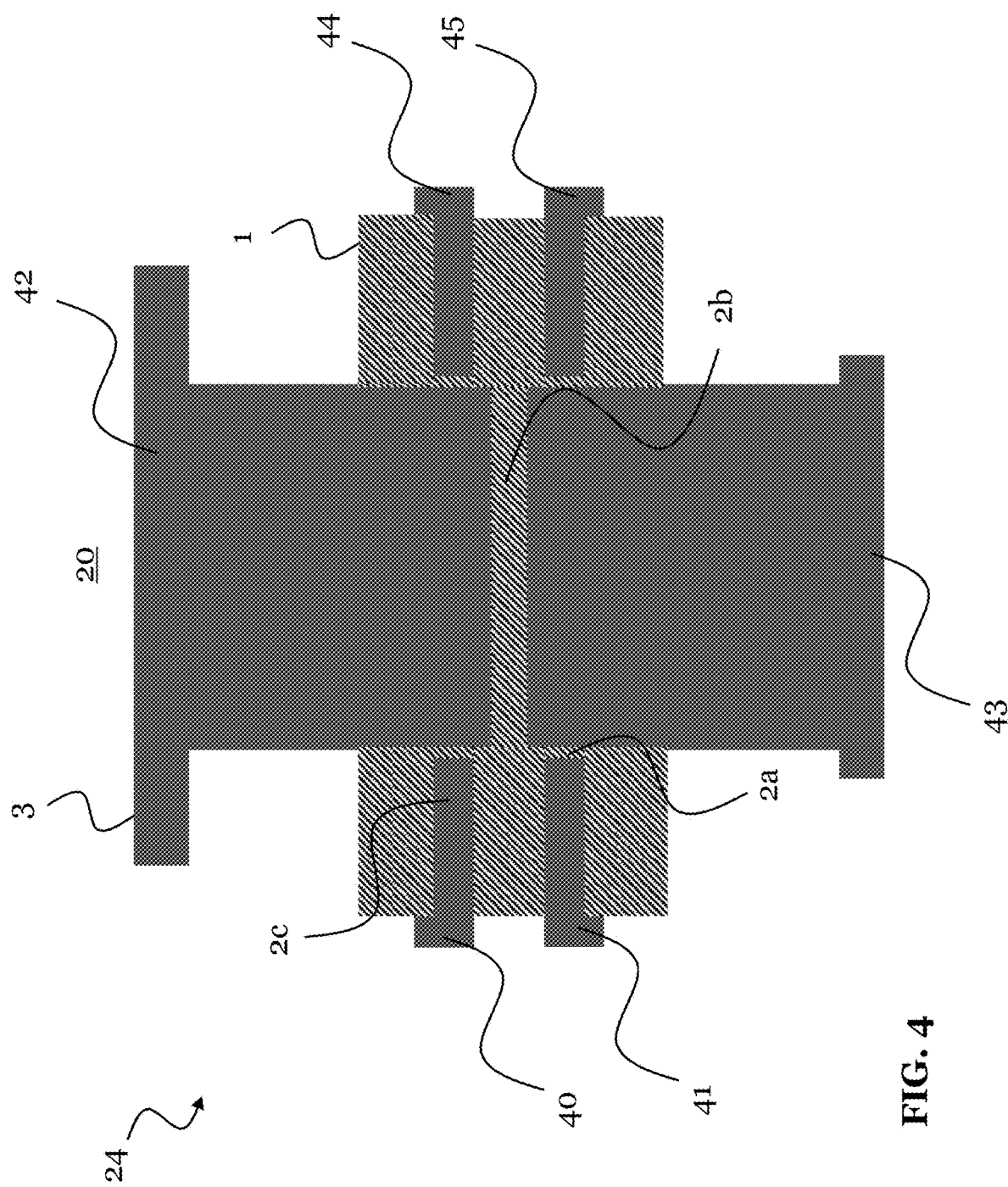
FIG. 4 illustrates a further step of the method, in accordance with an example embodiment.

FIG. 4 shows step 24 of the method 20. In step 24, the remaining gate layer 3 (i.e., after the removing step 23) is patterned into a gate structure including the at least two gates (i.e., gate electrodes), here example gates 41-45. In FIG. 4, a gate structure comprising, for instance, the two gates 41 and 43, is formed. The substructure 2a of the template structure 1 is arranged between the gates 41 and 43. Further, a gate 40 is formed, which has a width that corresponds to the width of the gap 2c in the template structure 1. Further, gates 42 and 43 are formed and the substructure 2b of the template structure 1 is arranged between these gates 42 and 43. The gates 44 and 45 may be like the gates 40 and 41.

The patterning of the gate layer 3 may be carried out by lithography, and in an example, by optical lithography, i.e., using a light field. The patterning of the gate layer 3 does not involve patterning of CDs (all structures with CD or less are fabricated by the steps of method 20 using the template structure 1). The patterning of the gate layer 3 may be self-aligned on the template structure 1. The patterning of the gate layer 3 may comprise etching of the gate layer 3, wherein the gate layer etch may be selective to the material of the template structure 1, i.e., the template structure 1 may act as an etch stop for the gate layer etch, i.e., withstands the gate layer etch.

Figure 5:
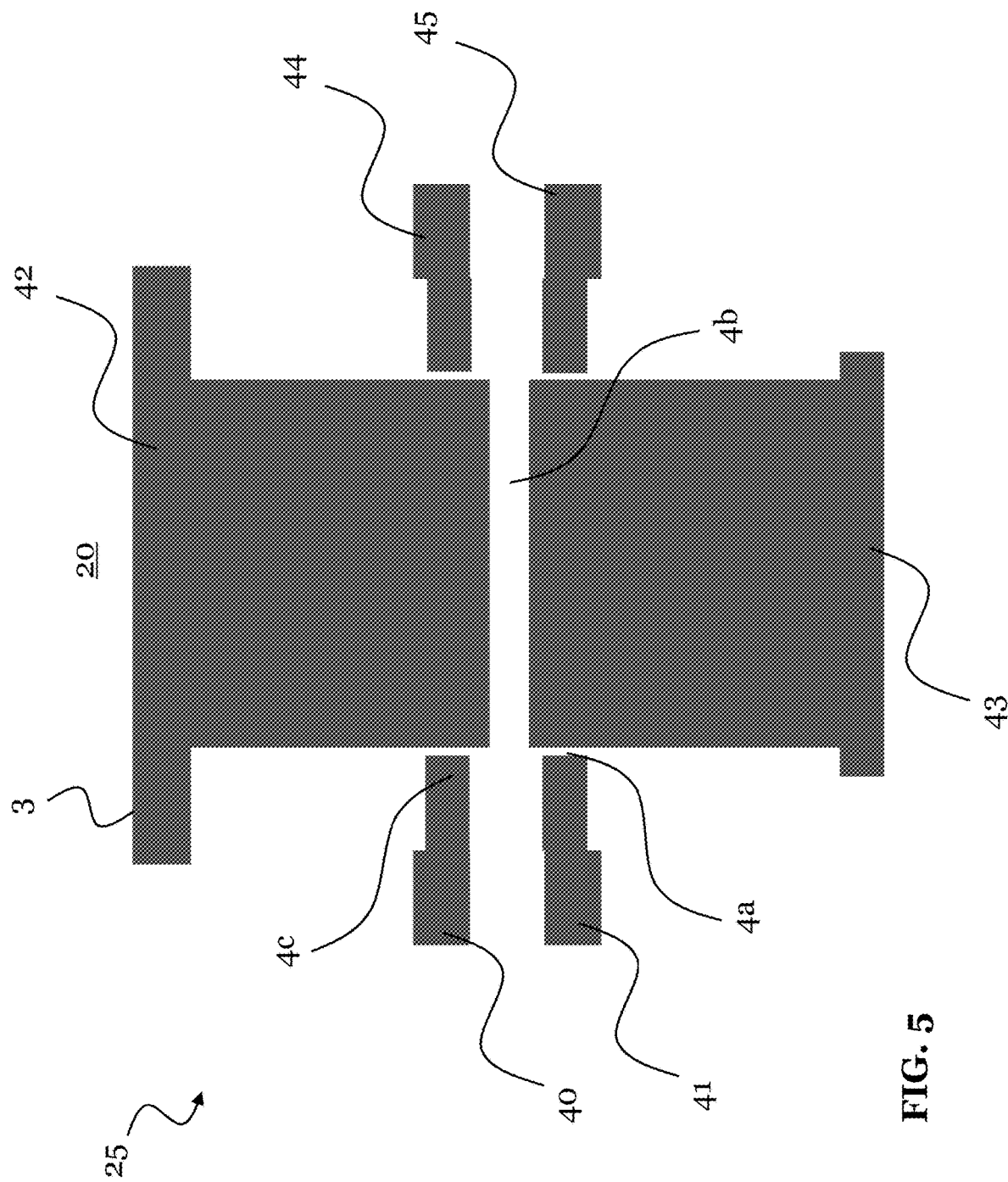
FIG. 5 illustrates a further step of the method, in accordance with an example embodiment.

FIG. 5 shows step 25 of the method 20. In particular, in step 25, the template structure 1 is selectively removed. It can be seen that removing the template structure 1 forms spacings in the gate layer 3. For instance, the spacing 4a is formed between the two gates 41 and 43 due to the removal of the sub-structure 2a. Further, the spacing 4b is formed between the gates 42 and 43 due to the removal of the sub-structure 2b. Thus, the method 20 facilitates structuring gates with very small spacings, i.e., equal to or below the CD, in a simple manner and with high reliability.

FIG. 6a-FIG. 7d show a specific method according to an embodiment, which builds on the method 20 shown in FIG. 2-FIG. 5.

FIG. 6a shows a layer structure that may be used to form the template structure 1 by lithography. In particular, the layer structure comprises a substrate 7 (e.g., silicon), an oxide layer 8 (e.g., silicon oxide), a template layer 1a, 1b, and a NTD resist 6a, 6b. The template layer 1a, 1b may comprise amorphous silicon 1b covered by a hardmask layer 1a. The hardmask layer 1a may comprise a $Si_3N_4$ layer, a SOC/SOG layer stack, or a SiOC/APF layer stack. The NTD resist 6a, 6b may comprise a SOC layer 6a and a SOG layer 6b. The NTD resist 6a, 6b may coat the template layer 1a, 1b.

The NTD resist 6a, 6b may then be patterned by electron beam printing and NTD. Notably, in case of such electron beam lithography, the SOC/SOG structure of the NTD resist is beneficial. If optical lithography or extreme ultraviolet lithography would be used instead, the NTD resist 6a, 6b may be formed by different, suitable layers.

FIG. 6b then shows the patterning of the template layer 1a, 1b into the template structure 1, i.e., corresponds to step 21. In particular, the patterning may comprise etching the template layer 1a, 1b using the patterned negative tone resist 6a, 6b as a mask to form the template structure 1. For instance, SOC/SOG may be etched first, followed by etching the hardmask layer 1a and the amorphous silicon 1b. A thickness of the hardmask layer 1a and amorphous silicon 1b may be selected to optimize the etching. The etching of the hardmask layer 1a and amorphous silicon may be selected to the oxide layer 8, i.e., the oxide layer 8 may act as an etch stop.

Figure 6:
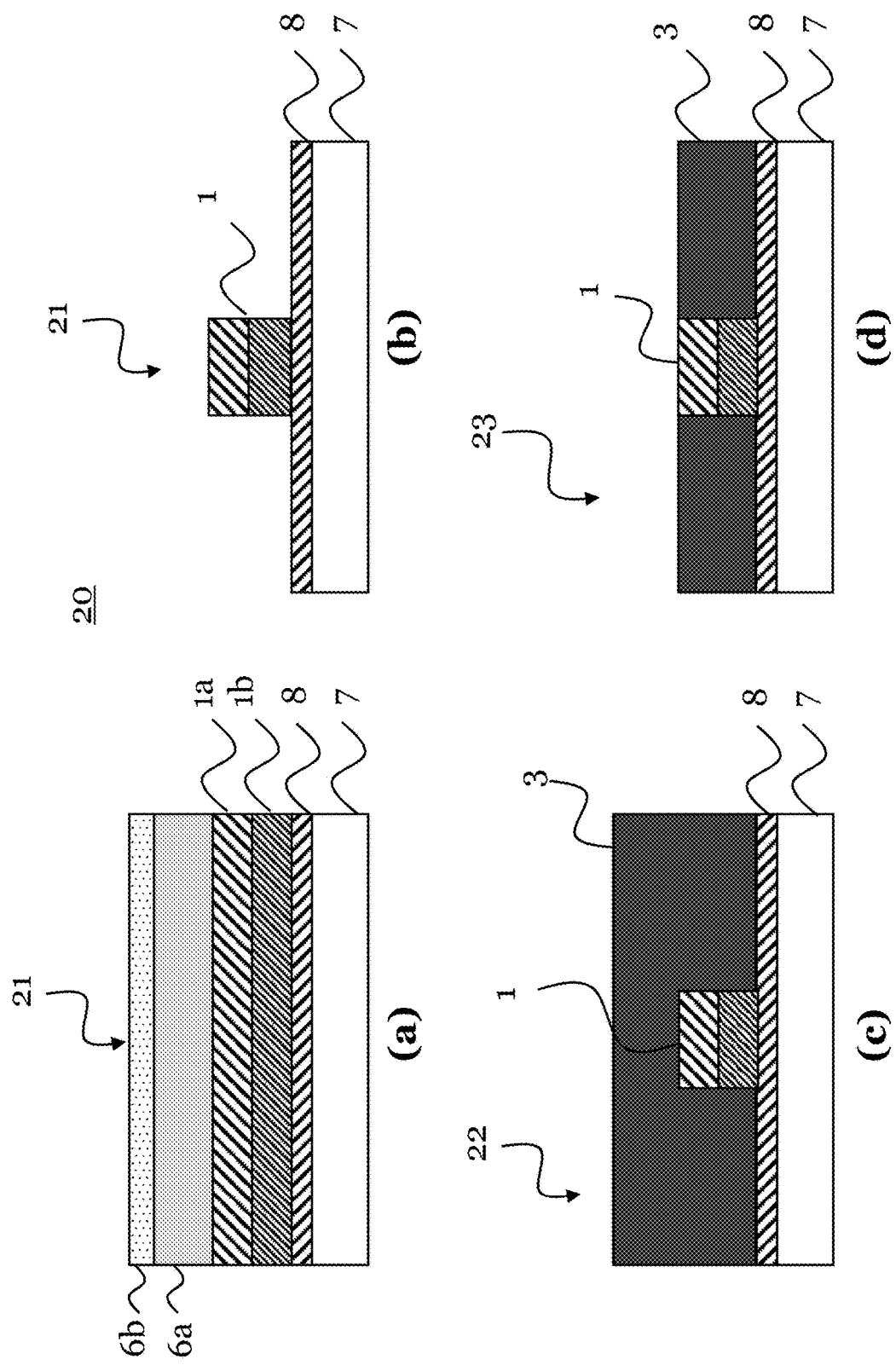
FIG. 6 shows steps of a detailed method for forming a semiconductor device, in accordance with an example embodiment.
Figure 7:
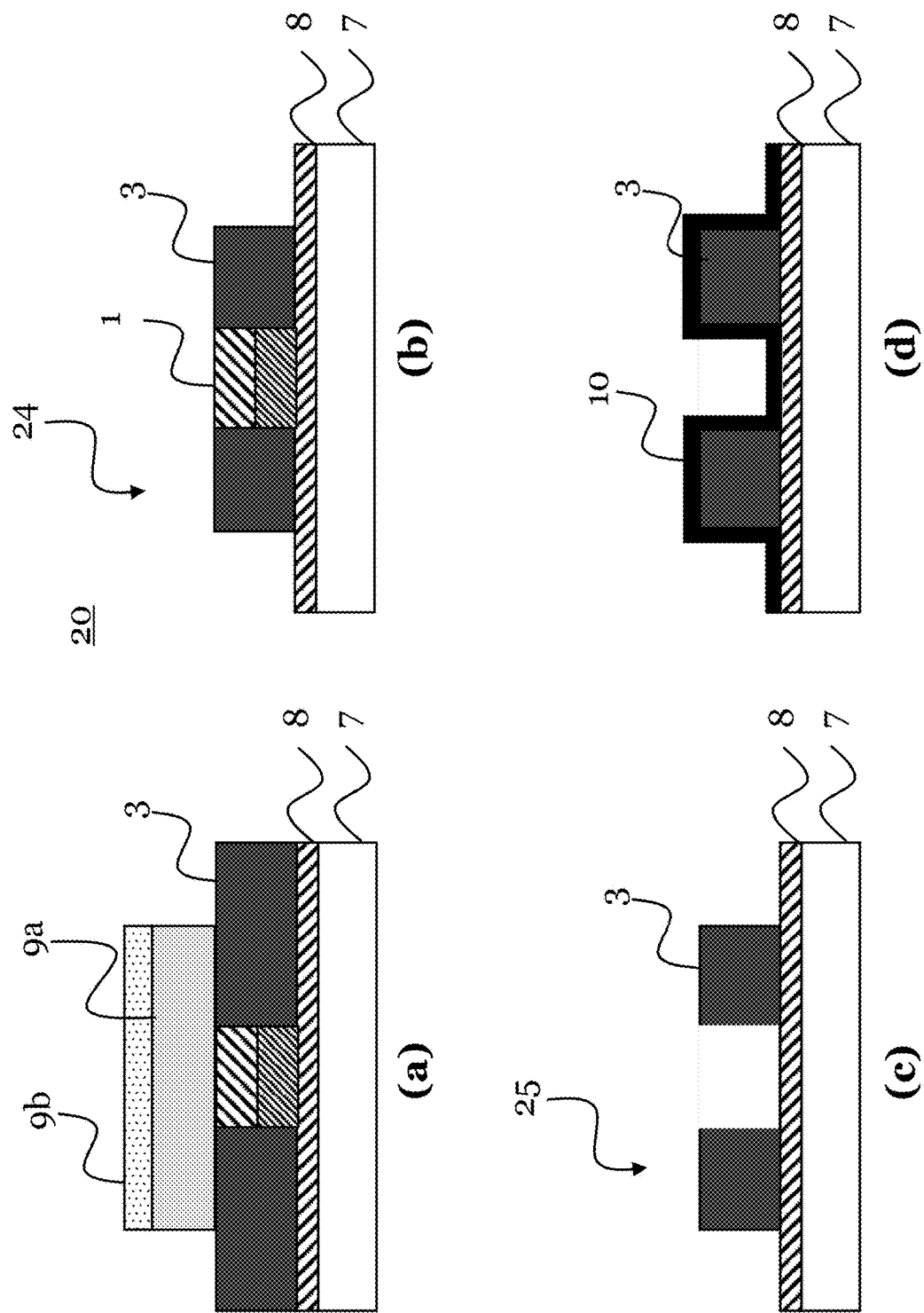
FIG. 7 shows further steps of the detailed method, in accordance with an example embodiment.

FIG. 6c shows the formation of the gate layer 3 on and around the template structure 1, i.e., corresponds to step 22. In particular, the gate layer 3 (e.g., TiN) may be deposited onto and surrounding the template structure 1. The gate layer 3 is deposited to be thicker (higher in FIG. 6) as the template structure 1.

FIG. 6d then shows the removal of the part of the gate layer 3 formed on the template structure 1, which corresponds to step 23. To this end, CMP can be used on the gate layer 3 material (e.g., TiN). The hardmask layer 1a (e.g., $Si_3N_4$) may thereby serve as an etch stop for the CMP. The template structure 1 surface is thereby exposed. The gate layer 3 and template structure 1 may form a common planar surface.

FIGS. 7a and 7b show patterning the gate layer 3 into a gate structure, thus corresponding to step 24. In particular, FIG. 7a shows a lithography of the gate layer 3. To this end, a resist comprising SOC and SOG may be coated onto the gate layer 3 and template structure 1, and patterned into an etch mask.

FIG. 7b shows etching the gate layer 3 using the etch mask. Further, in order to preserve the template structure 1, the hardmask layer 1a of the template structure may not be affected by the gate layer 3 etch, and also the oxide layer 8 may serve as an etch stop.

FIG. 7c shows removing the template structure 3, and thus corresponds to step 25. By removing the template structure 1, the spacings between the gate structure are formed, e.g., the spacings 4a and 4b shown in FIG. 4. The template structure 1 may be selectively removed by wet etching using a hot phosphoric acid, or by selective dry etching.

FIG. 7d is optional and shows the deposition of a gate dielectric 10 (e.g., silicon oxide, in a range of 5-10 nm) onto the gate structure.

Figure 8:
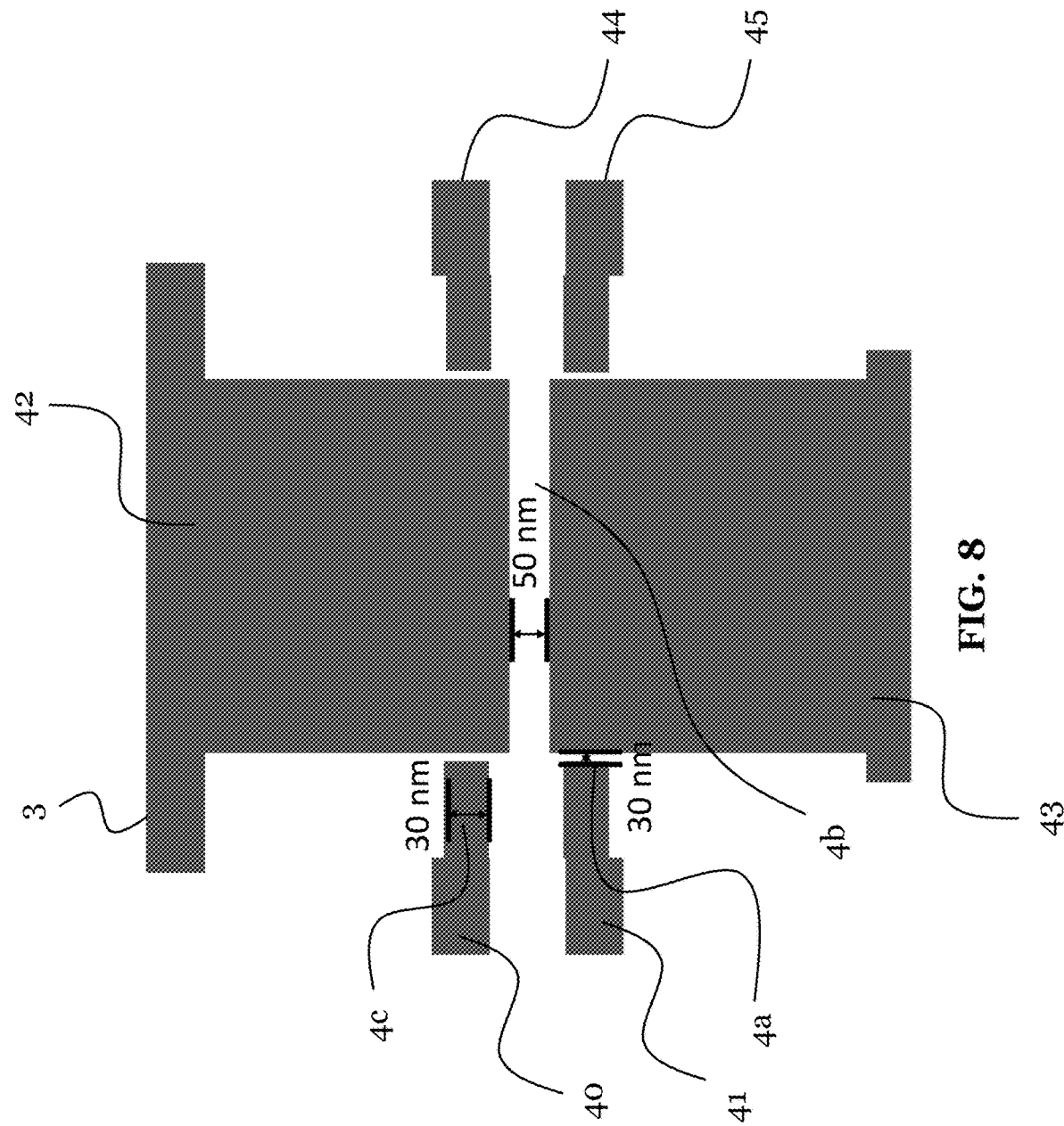
FIG. 8 illustrates critical structural features of gates of a semiconductor device, in accordance with an example embodiment.

FIG. 8 shows a resulting gate structure (structured gate layer 3) for a semiconductor device 90, which is shown in FIG. 9. The semiconductor device 90 is fabricated by using the method 20. The semiconductor device 90 of FIG. 9 comprises two SETs, which are coupled to a string of QDs. The gate structure of FIG. 8 shows that two gates 40 and 41 are formed for a first SET, and two gates 44 and 45 are formed for a second SET. Further, two confinement gates 42 and 43 are formed for defining the string of QDs.

A spacing 4a between a gate 41 of a SET and a confinement gate 43 is in the range of 30 nm or smaller (the same holds for the tip-to-tip distances of the other SET gates 40, 41, 44, 45 to the respective close confinement gate 42, 43). That is, the spacing 4a (formed by removing the sub-structure 2a) separates a gate 41 of the SET from a confinement gate 43. Further, a spacing 4b between the two confinement gates 42 and 43 is in the range of 50 nm or smaller. That is, the two confinement gates 42 and 43 are separated by the second spacing 4b (e.g., formed by removing the second sub-structure 2b). Further, a gate length 4c of the SET gate 40 (and each other SET gate 41, 44, 45) may be on the order of 30 nm (defined by the width of the respective gate electrode, and initially by the gap 2c).

As described, the method 20 facilitates fabricating a semiconductor device 90. In particular, the method 20 facilitates the fabrication of a semiconductor device having, in an example, a tunable tip-to-tip spacing of 5-50 nm, and in another example, a tunable tip-to-tip spacing of 5-30 nm. Further optimization is feasible to achieve tip-to-tip spacings below 5 nm gaps. In addition, the method 20 reduces the charge noise in the semiconductor device 90 by reducing the number of gate layers (and by consequence gate dielectrics). Further, the patterning of the gate layer 3 can be self-aligned on the template structure 1, leading to a simpler process. Furthermore, the patterning of the gate layer 3 into the gate structure can be simplified and less critical.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method for processing a semiconductor device comprising two gates separated by a lateral spacing, the method comprising:
    forming a template structure, wherein the template structure includes at least one sub-structure having a dimension less than the lateral spacing;
    forming a gate layer on and around the template structure;
    removing a part of the gate layer formed on the template structure;
    forming an etch mask on a portion of a remaining gate layer;
    etching based on the etch mask the remaining gate layer to form a gate structure including the two gates, wherein the etch mask is aligned to the template structure; and
    selectively removing the template structure, wherein the lateral spacing between the two gates is formed by removal of the at least one sub-structure of the template structure; and wherein the lateral spacing is 50 nm or less.

2. The method according to claim 1, wherein:
the lateral spacing is 30 nm or less.

3. The method according to claim 2, wherein:
the template structure is formed by at least one of: electron beam lithography, optical lithography, or extreme ultraviolet lithography.

4. The method according to claim 3, wherein forming the template structure by electron beam lithography comprises printing a shape of the template structure into a negative tone resist by electron beam.

5. The method according to claim 3, wherein forming the template structure comprises:
    providing a template layer;
    coating the template layer with a negative tone resist;
    patterning the negative tone resist by electron beam printing and negative tone development; and
    etching the template layer using a patterned negative tone resist as a mask.

6. The method according to claim 5, wherein:
the negative tone resist comprises a spin on carbon (SOC) layer or a spin on glass (SOG) layer.

7. The method according to claim 1, wherein:
the template structure is formed by at least one of: electron beam lithography, optical lithography, or extreme ultraviolet lithography.

8. The method according to claim 1, wherein:
the template structure comprises amorphous silicon covered by a hardmask layer.

9. The method according to claim 8, wherein:
the hardmask layer comprises at least one of: a $Si_3N_4$ layer, a SOC/SOG layer stack, or a SiOC/Advanced Patterning Film (APF) layer stack.

10. The method according to claim 1, wherein:
the part of the gate layer (3) formed on the template structure (1) is removed by chemical mechanical polishing, CMP.

11. The method according to claim 10, wherein:
the template structure comprises amorphous silicon covered by a hardmask layer,
the hardmask layer comprises at least one of: a $Si_3N_4$ layer, a SOC/SOG layer stack, or a SiOC/Advanced Patterning Film (APF) layer stack, and
the hardmask layer serves as an etch stop for the CMP.

12. The method according to claim 11, wherein:
patterning a remaining gate layer into the gate structure comprises etching the gate layer, wherein the hardmask layer serves as an etch stop for the gate layer etching.

13. The method according to claim 1, wherein:
the template structure comprises amorphous silicon covered by a hardmask layer,
the hardmask layer comprises at least one of: a $Si_3N_4$ layer, a SOC/SOG layer stack, or a SiOC/Advanced Patterning Film (APF) layer stack,
the hardmask layer comprises at least one of: a $Si_3N_4$ layer, a SOC/SOG layer stack, or a SiOC/Advanced Patterning Film (APF) layer stack, and patterning a remaining gate layer into the gate structure comprises etching the gate layer, wherein the hardmask layer serves as an etch stop for the gate layer etching.

14. The method according to claim 1, wherein:
the gate layer comprises titanium nitride.

15. The method according to claim 1, wherein:
the template structure is removed by wet etching using a hot phosphoric acid, or is removed by selective dry etching.

16. The method according to claim 1, wherein:
the etch mask comprises a spin on carbon (SOC) layer and a spin on glass (SOG) layer.

\* \* \* \* \*